(12) United States Patent
Subashchandrabose et al.

(10) Patent No.: US 8,527,836 B2
(45) Date of Patent: Sep. 3, 2013

(54) RANK-SPECIFIC CYCLIC REDUNDANCY CHECK

(75) Inventors: Ramesh Subashchandrabose, Bangalore (IN); Tessil Thomas, Bangalore (IN); Sambaran Mitra, Barasat (IN); Debaleena Das, Los Gatos, CA (US); Kai Cheng, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 169 days.

(21) Appl. No.: 13/175,472

(22) Filed: Jul. 1, 2011

(65) Prior Publication Data

US 2013/0007560 A1  Jan. 3, 2013

(51) Int. Cl.
*H03M 13/00* (2006.01)
*G11C 29/00* (2006.01)
*G06F 12/06* (2006.01)

(52) U.S. Cl.
USPC .......... 714/758; 714/753; 714/756; 714/767; 714/768; 714/769; 714/773; 714/784; 711/5

(58) Field of Classification Search
USPC ................. 714/753, 756, 758, 767, 768, 769, 714/773, 784; 711/5
See application file for complete search history.

(56) References Cited

U.S. PATENT DOCUMENTS

| | | | |
|---|---|---|---|
| 7,133,960 B1* | 11/2006 | Thompson et al. ............... 711/5 |
| 7,149,945 B2* | 12/2006 | Brueggen ...................... 714/758 |
| 7,177,211 B2* | 2/2007 | Zimmerman ................. 365/201 |
| 7,243,205 B2* | 7/2007 | Freeman et al. .............. 711/200 |
| 7,308,638 B2* | 12/2007 | Nerl et al. ..................... 714/763 |
| 7,404,055 B2* | 7/2008 | Bains et al. .................... 711/165 |
| 7,437,651 B2* | 10/2008 | Nerl et al. ..................... 714/767 |
| 7,454,586 B2* | 11/2008 | Shi et al. ....................... 711/167 |
| 7,650,457 B2* | 1/2010 | Ruckerbauer ..................... 711/5 |
| 7,870,459 B2* | 1/2011 | Hazelzet ....................... 714/753 |
| 7,872,892 B2* | 1/2011 | MacWilliams et al. ......... 365/52 |
| 7,957,216 B2 | 6/2011 | Bains et al. |
| 8,064,237 B2* | 11/2011 | MacWilliams et al. ......... 365/52 |
| 8,086,783 B2* | 12/2011 | O'Connor et al. ................ 711/5 |
| 8,140,936 B2* | 3/2012 | Gower et al. ................. 714/758 |
| 8,245,105 B2* | 8/2012 | Dell et al. ..................... 714/758 |
| 8,310,854 B2* | 11/2012 | MacWilliams et al. ......... 365/52 |
| 8,321,758 B2* | 11/2012 | Pescatore ...................... 714/763 |
| 8,359,521 B2* | 1/2013 | Kim et al. ..................... 714/758 |
| 8,381,064 B2* | 2/2013 | Hazelzet ....................... 714/753 |
| 2005/0289440 A1* | 12/2005 | Nerl et al. ..................... 714/763 |
| 2006/0114909 A1 | 6/2006 | Uzrad-Nali et al. |
| 2007/0089032 A1* | 4/2007 | Alexander et al. ............ 714/763 |
| 2008/0162833 A1 | 7/2008 | Chung et al. |
| 2009/0251988 A1 | 10/2009 | Kim et al. |
| 2009/0319877 A1 | 12/2009 | Bains et al. |
| 2010/0005214 A1 | 1/2010 | Trombley et al. |
| 2011/0138261 A1* | 6/2011 | Bains et al. ..................... 714/800 |

OTHER PUBLICATIONS

International Search Report and Written Opinion mailed Dec. 20, 2012 for PCT Application No. PCT/US2012/044734, 9 pages.

* cited by examiner

*Primary Examiner* — John J Tabone, Jr.
(74) *Attorney, Agent, or Firm* — Schwabe, Williamson & Wyatt, P.C.

(57) ABSTRACT

Embodiments of the present disclosure describe methods, apparatus, and system configurations for providing rank-specific cyclic redundancy checks in memory systems.

21 Claims, 7 Drawing Sheets

RANK-SPECIFIC CYCLIC REDUNDANCY CHECK

FIELD

Embodiments of the present disclosure generally relate to the field of error detection, and more particularly, to a rank-specific cyclic redundancy check.

BACKGROUND

Dual device data correction (DDDC) memory modules may be capable of recovering from a single memory device failure of a rank by mapping out the failed device and utilizing redundancy found elsewhere in the rank. However, if a second device were to fail on the rank, the error correction code (ECC) protection may be weakened with a corresponding increase in the risk of silent data corruption (SDC). While cyclic redundancy check (CRC) codes may be used to reduce the chance of SDC (or for other purposes such as distinguishing between channel and dynamic random access memory storage errors to enable an effective repair policy), their use may also be associated with performance degradation.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example and not by way of limitation in the figures of the accompanying drawings.

DETAILED DESCRIPTION

In the following detailed description, reference is made to the accompanying drawings which form a part hereof wherein like numerals designate like parts throughout, and in which is shown by way of illustration embodiments that may be practiced. It is to be understood that other embodiments may be utilized and structural or logical changes may be made without departing from the scope of the present disclosure. Therefore, the following detailed description is not to be taken in a limiting sense, and the scope of embodiments is defined by the appended claims and their equivalents.

Various operations may be described as multiple discrete actions or operations in turn, in a manner that is most helpful in understanding the claimed subject matter. However, the order of description should not be construed as to imply that these operations are necessarily order dependent. In particular, these operations may not be performed in the order of presentation. Operations described may be performed in a different order than the described embodiment. Various additional operations may be performed and/or described operations may be omitted in additional embodiments.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B and C).

The description may use the phrases "in an embodiment," or "in embodiments," which may each refer to one or more of the same or different embodiments. Furthermore, the terms "comprising," "including," "having," and the like, as used with respect to embodiments of the present disclosure, are synonymous.

Various entities may be introduced and described with respect to the operations they perform. It will be understood that these entities may include hardware, software, and/or firmware elements that are cooperatively configured to provide the described operations.

Embodiments of the present disclosure describe enablement of CRC on a specific rank of a memory module when a CRC-enable condition occurs. The CRC-enable condition may be a predetermined number of memory devices failing on a given rank. Embodiments provide a micro-architectural solution to provide dynamic memory bus controls to accommodate rank-specific CRC. This may involve changing command blackout timer thresholds when a memory command is scheduled to the CRC-enabled rank.

Figure 1:
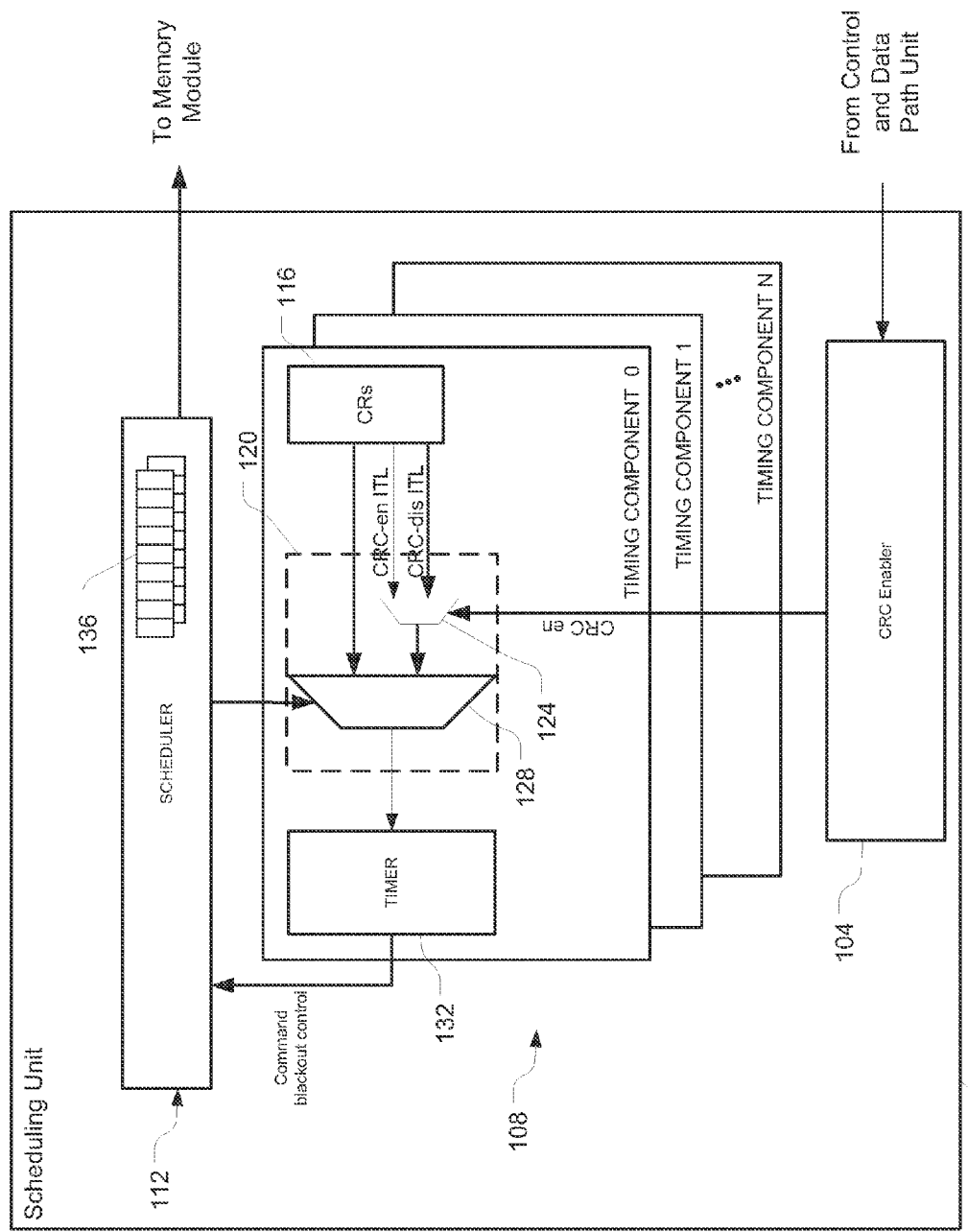
FIG. 1 schematically illustrates a scheduling unit in accordance with some embodiments.
Figure 2:
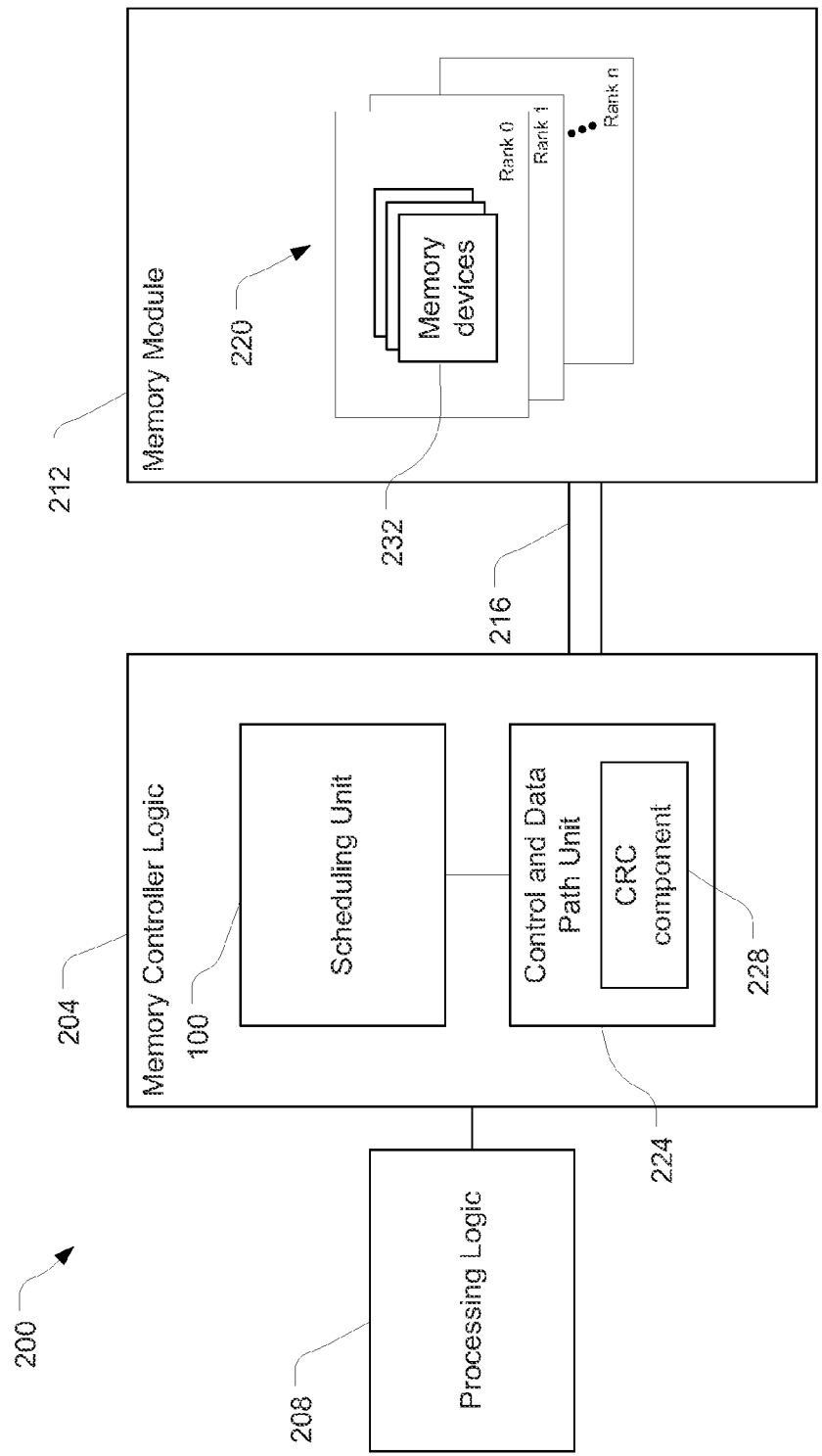
FIG. 2 schematically illustrates a system including the scheduling unit of FIG. 1 in accordance with some embodiments.

FIG. 1 illustrates a scheduling unit 100 in accordance with some embodiments. FIG. 2 illustrates a system 200 showing the scheduling unit 100 within the context of a memory controller logic 204 that is coupled with a processing logic 208 and a memory module 212 in accordance with some embodiments. The scheduling unit 100 may schedule memory commands with respect to the memory module 212. The scheduling unit 100, as shown in FIG. 1, may include a CRC enabler 104 coupled with a plurality of timing components 108. The timing components 108 may, in turn, be coupled with a scheduler 112.

Individual timing components 108 may respectively correspond to individual ranks 220 of the memory module 212 and may control command scheduling based on presently-issued commands. Each of the timing components 108 may have an architecture similar to timing component 0, which will now be described.

Timing component 0 may include configuration registers (CRs) 116 that provide a plurality of values that correspond to inter-rank turnaround latencies (ITLs) needed to accommodate various memory commands. The CRs 116 may be coupled with, and provide the ITLs to, selection logic 120. The selection logic 120 may include multiplexers 124 and 128 that selectively provide a single output value that is provided to a timer 132. The value provided by the selection logic 120 may be controlled by control signals received from the scheduler 112 and/or the CRC enabler 104, as will be described below.

The timer 132 may generate a command blackout control, corresponding to the output value provided by the selection logic 120, and provide the command blackout control to the scheduler 112. In some embodiments the timer 132 may be a countdown timer that is set with the output value from the selection logic 120. In these embodiments, the command blackout control may be active while the timer 132 is counting down and may be inactive once the timer 132 has expired.

The scheduler 112 may schedule memory commands stored in command queues 136 based on the command blackout controls received from the timing components 108. The memory commands may be provided to the memory control module 204 with the corresponding data being transferred via memory channel 216.

In general, the scheduling unit 100 may operate to ensure that a memory command has sufficient time to clear the memory channel 216 before a subsequent command is scheduled with respect to any other rank sharing the memory channel 216. For example, if a read command is scheduled to rank 1, another read command should not be scheduled to any other rank accessed through memory channel 216 for an amount of time required for returned data to clear the memory channel 216. In this example, assuming it takes 2 data clocks (DCLKS) to return the data, the selection logic 120 may provide a value of 2 to the timer 132. The timer 132 may initialize its countdown timer to 2, set the command blackout control to active, and decrement its countdown timer by one every data clock. Once the countdown timer expires, the timer 132 may set the command blackout control to inactive. The scheduler 112 may, therefore, not schedule a read command to any of the ranks that share the memory channel 216 until the timer 132 expires.

The amount of time for a memory command to clear the memory channel 216 may depend on whether CRC is enabled for a particular rank. Therefore, embodiments of the present disclosure provide the CRC enabler 104 and the selection logic 120 to accommodate rank-specific activation of CRC. In particular, the CRC enabler 104 may keep track of a CRC status for each of the ranks 220 and control the multiplexer 124 on the corresponding timing component to either provide a CRC-enabled ITL or a CRC-disabled ITL to the multiplexer 128. The CRC-enabled ITL may be a value associated with a particular memory command when CRC is being performed with respect to the memory command. The CRC-disabled ITL may be a value associated with the same memory command when CRC is not being performed. The CRC-enabled ITL may be equal to the CRC-disabled ITL plus a CRC delta. In some embodiments, including the one described below with respect to FIG. 4, a CRC-disabled ITL for a read command may be two, a CRC delta may be three, and the CRC-enabled ITL may, therefore, be five.

In some embodiments, the CRC enabler 104 may be coupled with a CRC component 228 in the control and data path unit 224. In other embodiments, the CRC enabler 104 and the CRC component 228 may be combined and located in the scheduling unit 100, the control and data path unit 224, or elsewhere. In addition to calculating and checking CRC values, as will be described below, the CRC component 228 may monitor the various ranks for a CRC-trigger condition and provide the CRC enabler 104 with an indication of the CRC-trigger condition.

In some embodiments, a CRC-trigger condition may correspond to failure of a certain number of memory devices 232, e.g., dynamic random access memory (DRAM) devices, of a particular rank. For example, as briefly discussed above, a dual device data correction (DDDC) memory module may be capable of recovering from a single device failure by mapping out the failed device and utilizing redundancy found elsewhere in the memory module. However, if a second device in a rank were to fail, the error correction code (ECC) protection may be weakened with a corresponding increase in the risk of silent data corruption (SDC). Therefore, if the memory module 212 is a DDDC memory module, failure of the second memory device of a rank may trigger the use of CRC processes with respect to memory commands issued to the rank. If the memory module 212 is a single device data correction (SDDC) memory module, failure of a single memory device of a rank may trigger the use of CRC processes. In other embodiments failure of other numbers of devices, or portions thereof, may be considered as the CRC-trigger condition.

In various embodiments, the CRC component 228 may also dynamically enable CRC with respect to the ranks 220. The CRC component 228 may dynamically enable CRC with respect to a target rank using either mode register set (MRS) programming or CRC on-the-fly. In MRS programming, the CRC component 228 may issue a system memory interrupt and block all the memory commands to the target rank. The CRC component 228 may wait for an amount of time that corresponds to the longest possible time any in-flight memory command may take to complete. The CRC component 228 may poll a particular CR to determine whether there are any outstanding memory commands. After determining there are no in-flight memory commands, the CRC component 228 may do a read-modify-write (RMW) of the mode register set (MRS) register of memory devices of the target rank to enable CRC. Thereafter, regular memory commands may be issued to functioning memory devices of the target rank.

Using CRC on-the-fly, the CRC component 228 may set a CRC-enable bit, e.g., an A12 bit, in memory commands issued to the target rank. The set-bit may provide an indication that CRC is associated with particular memory command.

CRC may be enabled for all memory commands to a rank, or only for selective memory commands. For example, it may not be necessary to enable CRC for both read and writes simultaneously. If enabling CRC for reads is acceptable, vis-à-vis, reliability, availability, and serviceability (RAS) parameters, it may be acceptable to disable CRC for writes, and vice versa.

Figure 3:
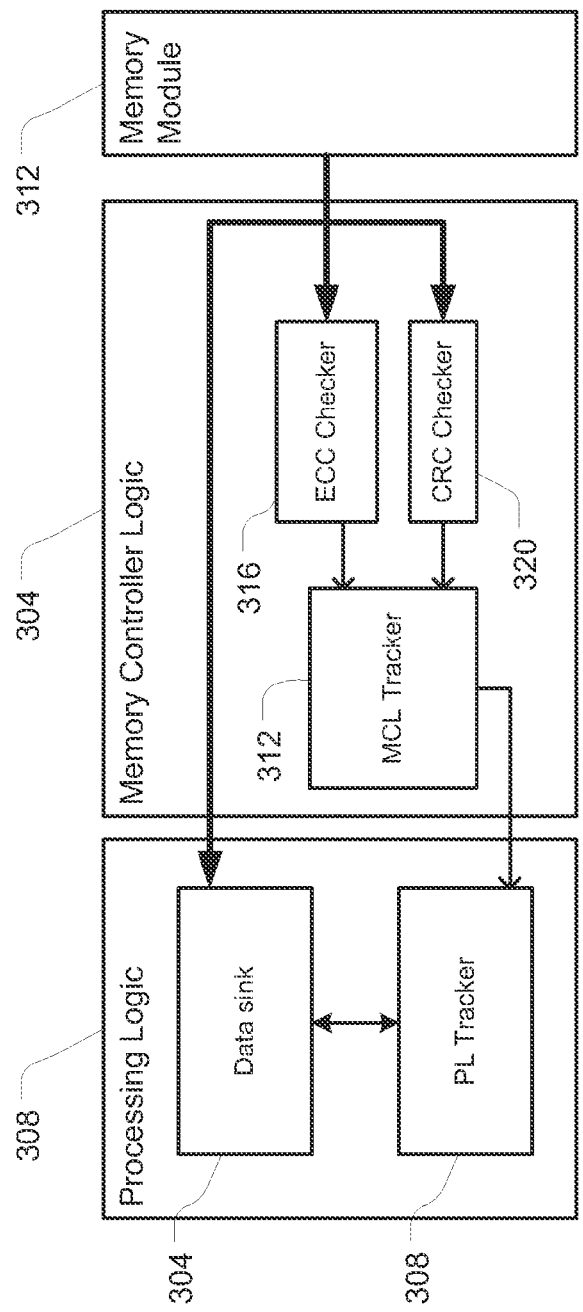
FIG. 3 schematically illustrates read-path components of the system of FIG. 2 in accordance with some embodiments.
Figure 4:
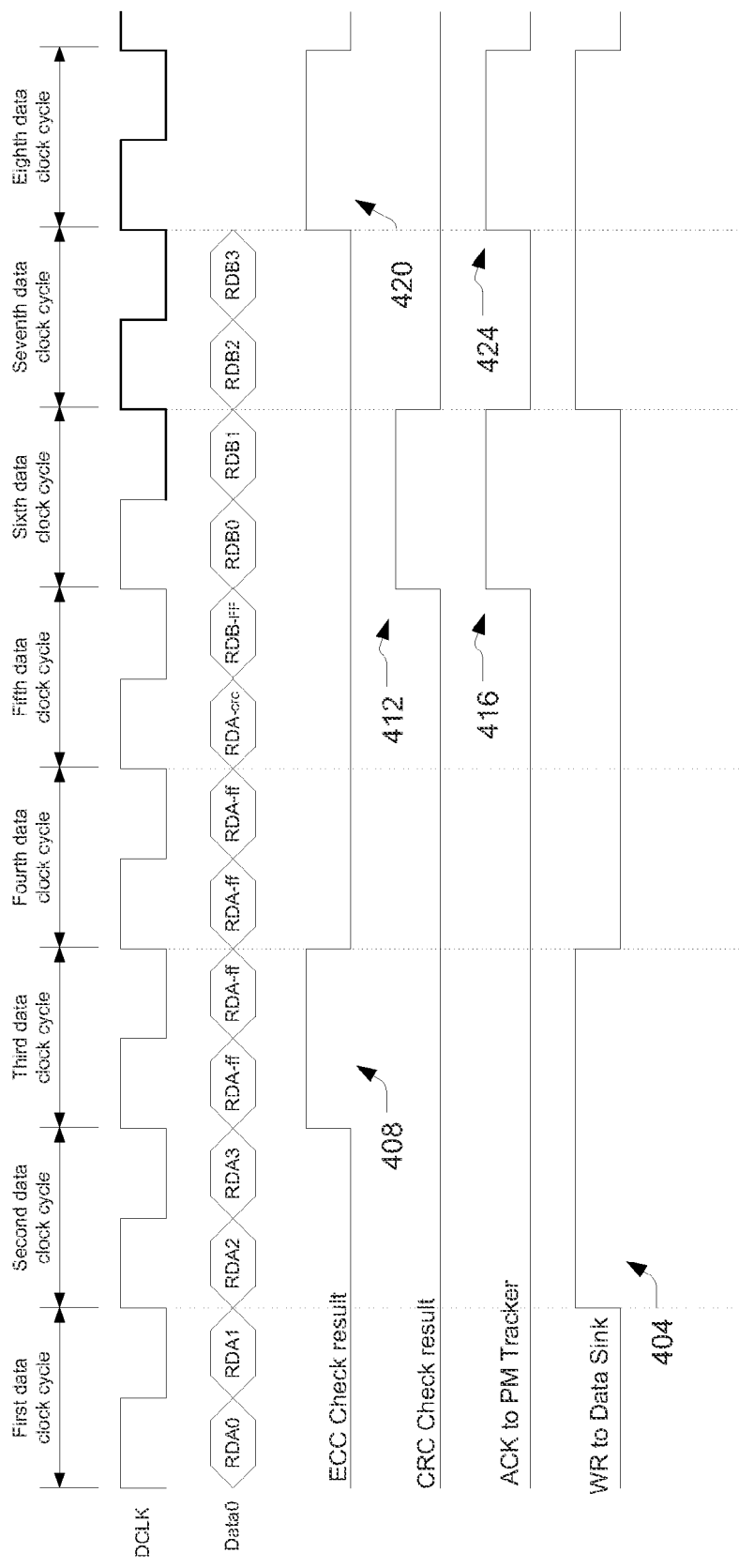
FIG. 4 illustrates waveforms associated with a read operation in accordance with some embodiments.

FIG. 3 illustrates read-path components of the system 200 in accordance with some embodiments. In particular, the processing logic 208 is shown with a data sink 304 that requests data and a processing logic (PL) tracker 308 to keep track of various requests. The memory controller logic 204 is shown with a memory controller logic (MCL) tracker 312, an ECC checker 316, and a CRC checker 320, which may be a part of the CRC component 228. FIG. 4 illustrates a number of waveforms that may be used to describe a read command flow with further reference to FIGS. 1-3 in accordance with some embodiments.

An example read command flow may now be described with respect to a first read command to location A in rank 0, in which CRC is enabled, and a second read command to location B in rank 1, in which CRC is disabled. The scheduler 112 may select, from the queues 136, the first read command. The scheduler 112 may issue a control signal to the multiplexer 128 of the timing component 0 to control the multiplexer 128 to output a value that corresponds to a read command for rank 0. Due to the enabling of CRC for rank 0, the CRC enabler 104 may control the multiplexer 124 to output the CRC-enabled ITL, e.g., 5, which may then be output by the multiplexer 128 to the timer 132. The timer 132 may activate the command blackout control for five data clock cycles to accommodate the read command to location A.

Referring now to FIG. 4, in the first and second data clock cycles, data (RDA0-RDA3) may be returned over the memory channel 216 from the memory module 212 to the memory controller logic 204. The returned data may be provided to the ECC checker 316 and the CRC checker 320 in parallel. The returned data may also be written directly to the data sink 304 in the second and third data cycles, represented by write pulse 404. The ECC checker 316 may perform an ECC check on the returned data and provide a resulting ECC check result 408 to the MCL tracker 312 in the third data cycle.

In the third and fourth data clock cycles, filler data (RDA-ff) may be transferred over the memory channel 216. In the fifth data clock cycle, CRC data (RDA-crc) corresponding to the returned data, may be transferred over the memory channel 216. The CRC checker 320 may perform a CRC check on the returned data and the CRC data and provide the resultant CRC check result 412 to the MCL tracker 312 in the following data cycle, i.e., the sixth data clock cycle.

Once the MCL tracker 312 has received both the ECC check result 408 and the CRC check result 412, it may issue an acknowledgment 416 to the PL tracker 308 indicating that the returned data is valid.

After the fifth data clock cycle, the command blackout control from timer 132 may deactivate, allowing the scheduler 112 to schedule the second read command to location B in rank 1. As CRC is disabled for rank 1, the selection logic of timing component 1 may output the CRC-disabled ITL, resulting in a timer of timing component 1 to activate the command blackout control for two data clock cycles.

The second read command may result in data (RDB0-RDB3) being returned in the sixth and seventh data clock cycles. As with the read from location A, the ECC checker 316 may perform an ECC check on the return data and provide a resulting ECC check result 420 in the following data clock cycle, i.e., the eighth data clock cycle. However, the MCL tracker 312 does not have to wait on the CRC data and the CRC check result in this instance and can issue an acknowledgment 424 simultaneously with the ECC check result 420.

Figure 5:
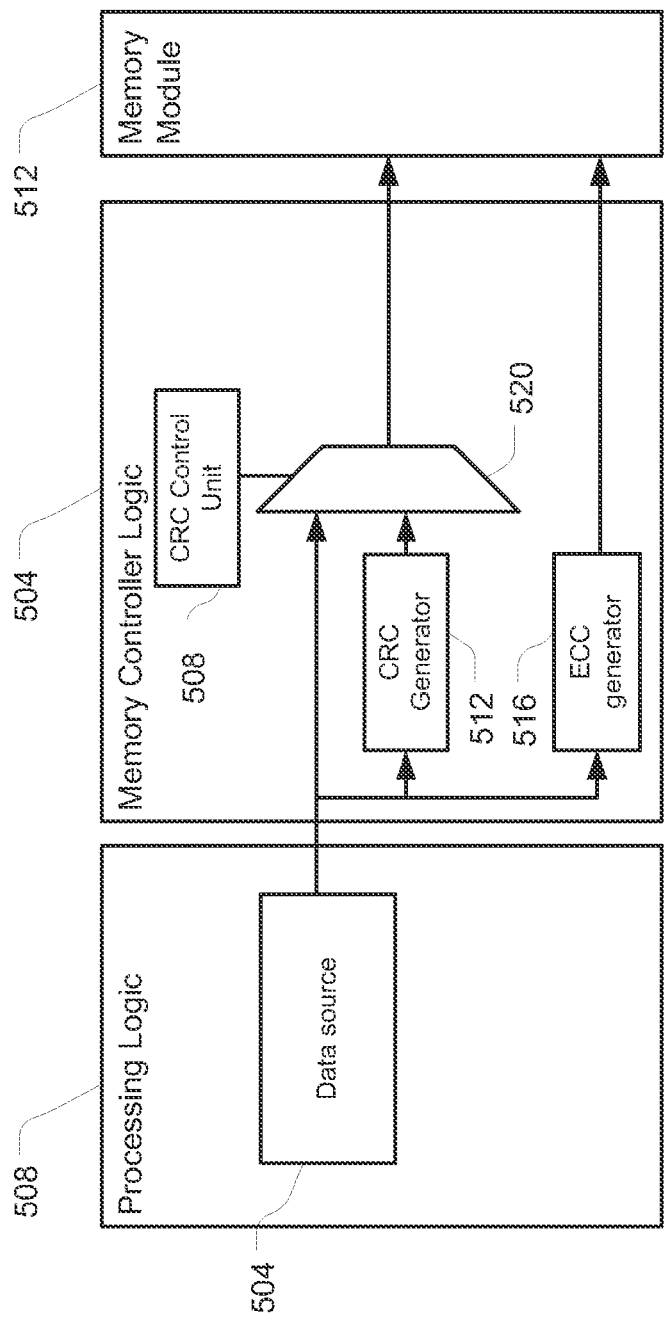
FIG. 5 schematically illustrates write-path components of the system of FIG. 2 in accordance with some embodiments.

The scheduling and access of either the CRC-enabled ITL or the CRCA-disabled ITL may be similar for a write command flow as described above with respect to the read command flow. The write-path components of the system 200 are illustrated in FIG. 5 in accordance with some embodiments. In particular, the processing logic 208 is shown with a data source 504; and the memory controller logic 204 is shown with a CRC control unit 508, a CRC generator 512, an ECC generator 516, and a multiplexer 520 coupled to one another at least as shown. The CRC control unit 508, the CRC generator 512, and the multiplexer 520 may be part of the CRC component 228.

The data source 504 may provide data to the memory controller logic 204 that is to be written in the memory module 212. The data may be provided to the multiplexer 520, the CRC generator 512 and the ECC generator 516. The CRC generator 512 and ECC generator 516 may respectively generate a CRC and an ECC corresponding to the data to be written to the memory module 212. The CRC generator may provide a copy of the data along with the CRC to the multiplexer 520. The CRC control unit 508 may control the multiplexer 520 in a manner such that the data and the CRC are output to the memory module 212 if CRC is enabled for the particular rank to which the data is to be written. If CRC is not enabled for the particular rank, the CRC control unit 508 may control the multiplexer 520 to output the data without the CRC.

Figure 6:
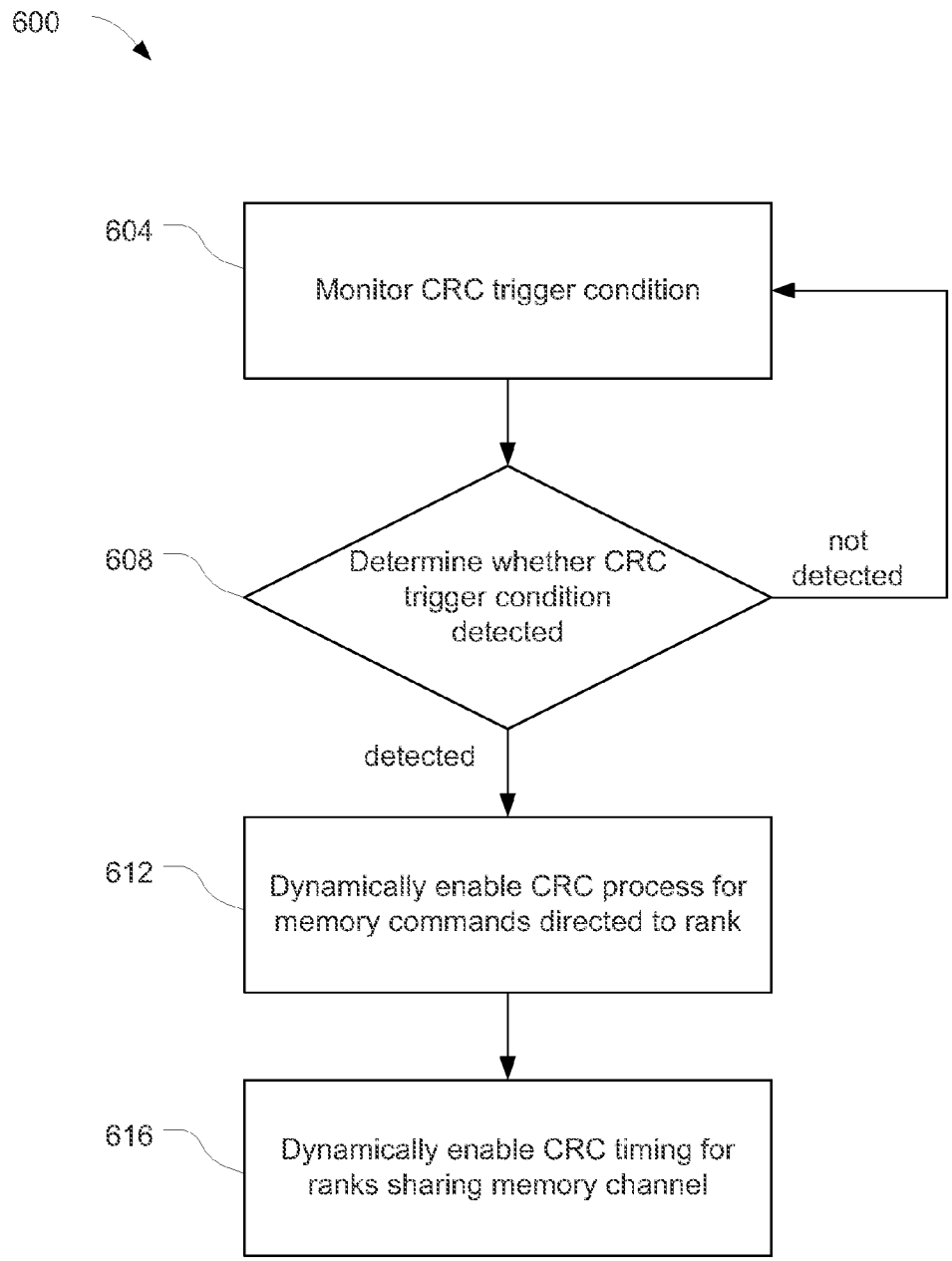
FIG. 6 is a flowchart depicting operation of a memory controller logic in accordance with some embodiments.

FIG. 6 is a flowchart 600 depicting operation of a memory controller logic in accordance with some embodiments. At block 604, an entity of a memory controller logic, e.g., a CRC component, may monitor CRC-trigger conditions with respect to ranks of a memory module. Monitoring CRC-trigger conditions may include tracking a number of failed memory devices on each rank.

At block 608, an entity of the memory controller logic, e.g., the CRC component, may determine whether a CRC-trigger condition is detected. A CRC-trigger condition may be detected when a predetermined number of memory devices fail for a given rank. If a CRC-trigger condition is not detected, the process may return to the monitoring of the CRC-trigger condition at block 604. If a CRC-trigger condition is detected, the process may advance to block 612.

At block 612, an entity of the memory controller logic, e.g., the CRC component, may dynamically enable CRC processes for memory commands directed to the rank associated with the CRC-trigger condition. In some embodiments, CRC processes may be dynamically enabled by MRS programming or CRC on-the-fly as described above.

At block 616, an entity of the memory controller logic, e.g., a CRC enabler, may dynamically enable CRC timing for ranks sharing a memory channel with the CRC-enabled rank. In some embodiments, the CRC enabler may receive an indication of the detection of the CRC-trigger condition from the CRC component. The CRC enabler may thereafter control scheduling logic, within a timing component that corresponds to the CRC-enabled rank, to provide a timer with the value that accommodates CRC memory commands with respect to that rank.

Described embodiments of the disclosure selectively employ CRC based on certain trigger conditions such as a predetermined number of device failures for a given rank. This selective employment of CRC may benefit the overall operation of the memory system by avoiding the performance degradation associated with CRC when it is not needed, and implementing CRC when desired. As discussed above, CRC may be desired when there is an increased likelihood of an unacceptable rate of SDC, to distinguish between channel and DRAM storage errors to enable an effective repair policy, or for other reasons.

Figure 7:
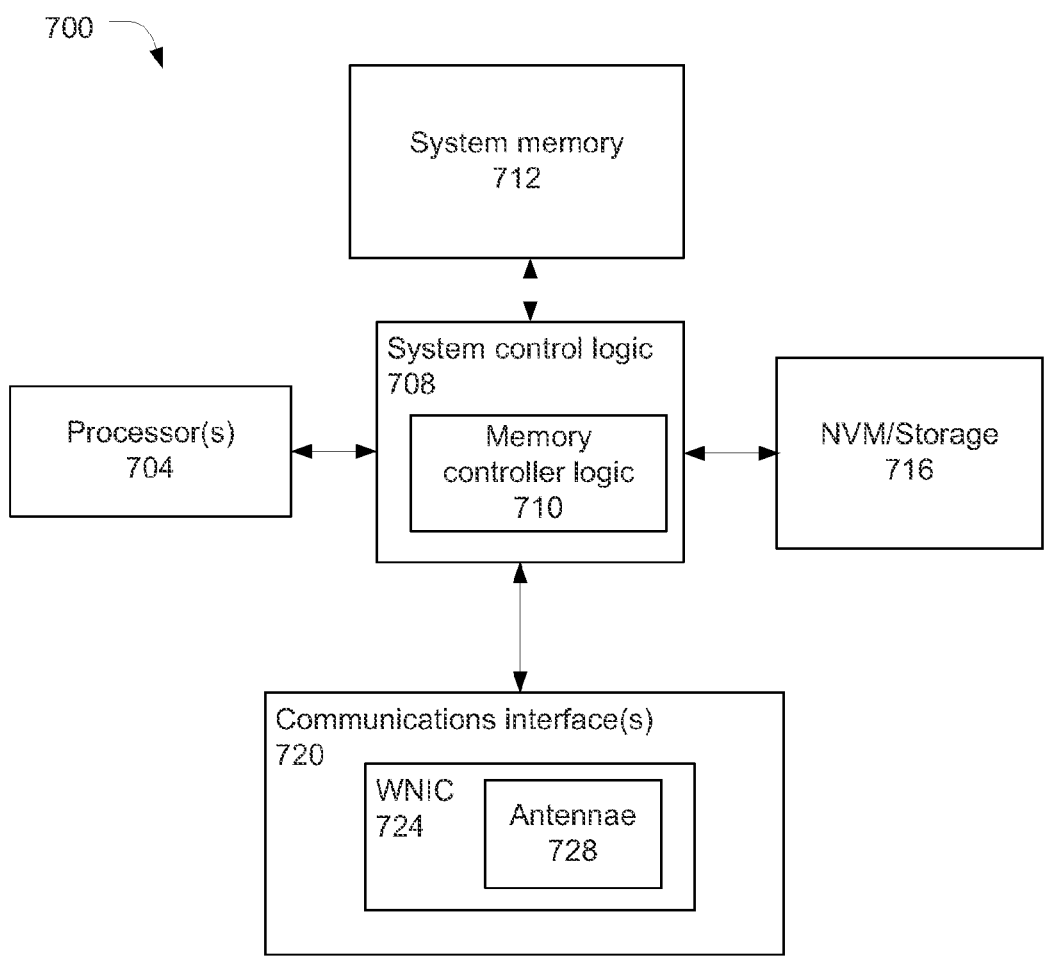
FIG. 7 is a system in accordance with some embodiments.

Embodiments of the present disclosure may be implemented into a system using any suitable hardware and/or software to configure as desired. FIG. 7 illustrates, for one embodiment, an example system 700 comprising one or more processor(s) 704, system control logic 708 coupled to at least one of the processor(s) 704, system memory 712 coupled to system control logic 708, non-volatile memory (NVM)/storage 716 coupled to system control logic 708, and one or more communications interface(s) 720 coupled to system control logic 708.

System control logic 708 for one embodiment may include any suitable interface controllers to provide for any suitable interface to at least one of the processor(s) 704 and/or to any suitable device or component in communication with system control logic 708.

System control logic 708 may include memory controller logic 710, which may be similar to memory controller logic 204, to provide an interface to system memory 712, which may be similar to memory module 212. The memory controller logic 710 may be a hardware module, a software module, and/or a firmware module. As described above, the memory controller logic 710 may selectively employ CRC based on certain trigger conditions such as a predetermined number of device failures for a given rank.

System memory 712 may be used to load and store data and/or instructions, for example, for system 700. System memory 712 for one embodiment may include any suitable volatile memory, such as suitable DRAM, for example. In some embodiments, the system memory 712 may include double data rate type four synchronous dynamic random-access memory (DDR4 SDRAM).

System control logic 708 for one embodiment may include one or more input/output (I/O) controller(s) to provide an interface to NVM/storage 716 and communications interface(s) 720.

The NVM/storage 716 may be used to store data and/or instructions, for example. NVM/storage 716 may include any suitable non-volatile memory, such as flash memory, for example, and/or may include any suitable non-volatile storage device(s), such as one or more hard disk drive(s) (HDD(s)), one or more compact disc (CD) drive(s), and/or one or more digital versatile disc (DVD) drive(s) for example.

The NVM/storage 716 may include a storage resource physically part of a device on which the system 700 is installed or it may be accessible by, but not necessarily a part of, the device. For example, the NVM/storage 716 may be accessed over a network via the communications interface(s) 720.

Communications interface(s) 720 may provide an interface for system 700 to communicate over one or more network(s) and/or with any other suitable device. In some embodiments, the communications interface(s) 720 may include a wireless network interface controller 724 having one or more antennae 728 to establish and maintain a wireless communication link with one or more components of a wireless network. The system 700 may wirelessly communicate with the one or more components of the wireless network in accordance with any of one or more wireless network standards and/or protocols.

For one embodiment, at least one of the processor(s) 704 may be packaged together with logic for one or more controller(s) of system control logic 708, e.g., memory controller logic 710. For one embodiment, at least one of the processor(s) 704 may be packaged together with logic for one or more controllers of system control logic 708 to form a System in Package (SiP). For one embodiment, at least one of the processor(s) 704 may be integrated on the same die with logic for one or more controller(s) of system control logic 708. For one embodiment, at least one of the processor(s) 704 may be integrated on the same die with logic for one or more controller(s) of system control logic 708 to form a System on Chip (SoC).

In various embodiments, the system 700 may be, but is not limited to, a server, a workstation, a desktop computing device, or a mobile computing device (e.g., a laptop computing device, a handheld computing device, a tablet, a netbook, etc.). In various embodiments, the system 700 may have more or less components, and/or different architectures.

Although certain embodiments have been illustrated and described herein for purposes of description, a wide variety of alternate and/or equivalent embodiments or implementations calculated to achieve the same purposes may be substituted for the embodiments shown and described without departing from the scope of the present disclosure. This application is intended to cover any adaptations or variations of the embodiments discussed herein. Therefore, it is manifestly intended that embodiments described herein be limited only by the claims and the equivalents thereof.

What is claimed is:

1. An apparatus comprising:
a cyclic redundancy check (CRC) enabler configured to receive an indication of a CRC-trigger condition with respect to a first rank of a plurality of ranks of a memory module, and to generate a CRC enable signal based on receipt of the indication; and
a plurality of timing components coupled with the CRC enabler, each timing component of the plurality of timing components to a rank of the plurality of ranks, wherein a first timing component of the plurality of timing components that corresponds to the first rank of the plurality of ranks is configured to generate a command blackout control to accommodate CRC for the first rank based on receipt of the CRC enable signal.

2. The apparatus of claim 1, wherein the indication of the CRC-trigger condition is an indication of a failure of a predetermined number of memory devices of the first rank.

3. The apparatus of claim 2, wherein the memory module is a dual device data correction (DDDC) memory module and the predetermined number is two.

4. The apparatus of claim 2, wherein the memory module is a single device data correction (SDDC) memory module and the predetermined number is one.

5. The apparatus of claim 1, wherein the first timing component comprises:
selection logic configured to selectively output a first value from a plurality of values based on the CRC enable signal; and
a timer, coupled with the selection logic, configured to generate the command blackout control based on the first value.

6. The apparatus of claim 5, wherein the plurality of ranks are configured to be accessed through a memory channel between a memory controller logic and the memory module, and the first value is configured to allot a plurality of data clock cycles sufficient to allow a memory command scheduled to the first rank to clear the memory channel prior to scheduling of a subsequent memory command to any other ranks of the plurality of ranks.

7. The apparatus of claim 5, further comprising:
a plurality of configurable registers (CRs) coupled with the selection logic;
wherein the selection logic includes a multiplexer configured to receive a CRC-enabled inter-rank turnaround latency (ITL) and a CRC-disabled ITL from the CRs and to output the CRC-enabled ITL based on receipt of the CRC-enable signal.

8. The apparatus of claim 1, further comprising:
a CRC component configured to dynamically enable CRC processes for memory commands directed to the first rank by mode register set (MRS) programming or CRC on-the-fly.

9. A method comprising:
detecting a cyclic redundancy check trigger condition for a first rank of a plurality of ranks of a memory module;
dynamically enabling CRC processes for memory commands issued to the first rank based on said detecting; and
dynamically enabling CRC timing for ranks of the plurality of ranks that share a memory channel with the first rank.

10. The method of claim 9, wherein detecting the CRC-trigger condition comprises:
detecting a predetermined number of memory device failures on the first rank.

11. The method of claim 10, wherein the memory module is a dual device data correction (DDDC) memory module and the predetermined number is two.

12. The method of claim 9, wherein dynamically enabling CRC processes comprises:
programming a mode register set register of memory devices of the rank.

13. The method of claim 9, wherein dynamically enabling CRC processes comprises:
setting a CRC-enable bit in the memory commands issued to the first rank.

14. The method of claim 9, wherein dynamically enabling CRC timing comprises:
generating a command blackout control based on a CRC-enabled inter-rank turnaround latency (ITL).

15. The method of claim 14, wherein generating the command blackout control comprises:
controlling selection logic in a timing component that corresponds to the rank to output the CRC-enabled ITL; and
generating, with a timer, the command blackout control based on the CRC-enabled ITL.

16. The method of claim 15, wherein controlling selection logic comprises:
controlling a multiplexer, which receives a CRC-enabled ITL and a CRC-disabled ITL, to output the CRC-enabled ITL.

17. One or more non-transitory computer readable media comprising instructions to, upon execution of the instructions by a computing device, cause the computing device to:
detect a cyclic redundancy check trigger condition for a first rank of a plurality of ranks of a memory module;
dynamically enable CRC processes for memory commands issued to the first rank based on said detecting; and
dynamically enable CRC timing for ranks of the plurality of ranks that share a memory channel with the first rank.

18. The one or more non-transitory computer readable media of claim 17, wherein the instructions to cause the computing device to detect the CRC-trigger condition comprise instructions to, upon execution of the instructions by the computing device, cause the computing device to detect a predetermined number of memory device failures on the first rank.

19. The one or more non-transitory computer readable media of claim 17, wherein the instructions to cause the computing device to dynamically enable CRC processes comprise instructions to, upon execution of the instructions by the computing device, cause the computing device to program a mode register set register of memory devices of the rank.

20. The one or more non-transitory computer readable media of claim 17, wherein the instructions to cause the computing device to dynamically enable CRC processes comprise instructions to, upon execution of the instructions by the computing device, cause the computing device to set a CRC-enable bit in the memory commands issued to the first rank.

21. The one or more non-transitory computer readable media of claim 17, wherein the instructions to cause the computing device to dynamically enable CRC timing comprise instructions to, upon execution of the instructions by the computing device, cause the computing device to generate a command blackout control based on a CRC-enabled inter-rank turnaround latency (ITL).

* * * * *